United States Patent [19]

Schmidt et al.

[11] Patent Number: 4,627,057
[45] Date of Patent: Dec. 2, 1986

[54] METHOD AND ARRANGEMENT FOR THE FUNCTIONAL TESTING OF COMPUTERS

[75] Inventors: Alfred Schmidt; Wolfram Pöttig, both of Munich, Fed. Rep. of Germany

[73] Assignee: M.A.N. Maschinenfabrik Augsburg-Nurnberg Aktiengesellschaft, Munich, Fed. Rep. of Germany

[21] Appl. No.: 512,033

[22] Filed: Aug. 5, 1983

[51] Int. Cl.$^4$ .............................................. G01R 31/28
[52] U.S. Cl. .......................................... 371/25; 371/27
[58] Field of Search ................. 324/73 R; 371/16, 25, 371/27, 57, 60, 68

[56] References Cited

U.S. PATENT DOCUMENTS

| | | | |
|---|---|---|---|
| 3,582,633 | 6/1971 | Webb | 371/25 |
| 3,924,181 | 12/1975 | Alderson | 324/73 R |
| 3,931,506 | 1/1976 | Borrelli et al. | 324/73 R X |
| 4,108,359 | 8/1978 | Proto | 371/25 |
| 4,251,885 | 2/1981 | Dodt et al. | 371/60 |
| 4,317,167 | 2/1982 | Hartig et al. | 371/16 X |
| 4,347,608 | 8/1982 | Appiano et al. | 371/16 |
| 4,365,334 | 12/1982 | Smith et al. | 371/27 |
| 4,380,068 | 4/1983 | de Couasnor | 371/25 X |
| 4,468,768 | 8/1984 | Sunkle et al. | 371/16 |

*Primary Examiner*—Charles E. Atkinson
*Attorney, Agent, or Firm*—Scully, Scott, Murphy and Presser

[57] ABSTRACT

Method and arrangement for the functional testing of computers used in the control of processes. A data word signal generated by the computer is compared in a comparator with a test word of the same bit length generated by a pseudo-random number generator. When the two words are completely coincident, the comparator issues a trigger pulse to two non-retriggerable monoflops which provide a time frame and the function of which is acknowledged dynamically to the computer through an acknowledgement line, which provides a shift clock pulse for the pseudo-random number generator upon the lapse of the window frame. When a fault arises in the computer or in the check unit, an alarm unit is triggered through an NOR gate to transfer the process into a defined safe state. All faults in the check unit itself can be detected by the computer through acknowledgement lines.

3 Claims, 3 Drawing Figures

METHOD AND ARRANGEMENT FOR THE FUNCTIONAL TESTING OF COMPUTERS

BACKGROUND OF THE INVENTION

1. Field of the Invention

The present invention relates to an arrangement for testing computers which are utilized for the control, regulating, or monitoring of processes.

Microcomputer-supported control systems are finding increasing application in areas which are subject to more stringent safety requirements.

This increasingly deals with processes in which, for reasons of safety, the process may not be stopped immediately upon occurrence of a malfunction, or which, for reasons of availability, will not stop. This task is generally solved through the employment of redundant regulating or control systems having two or more independent operational channels, which fulfill regulating or control tasks, and a microcomputer, wherein the microcomputer assumes the switching control, the monitoring and error locating in the two operational channels.

The safety concept proceeds from the assumption that the computer, as long as it operates faultlessly, will recognize errors in the control channels and, through corrective reaction can restore the system under its control into a safe condition. However, the functional reliability hereby ultimately still depends upon possible sources of error in the computer. Computer malfunctions can be limited in duration (for instance, power supply disruptions, crosstalk) or permanent (for instance, component failure). Typical fault conditions may result from stoppage of the computer (system pulse failure), when the computer runs in an endless loop; from data errors, particularly dynamic errors, dependent upon predetermined bit combinations; through a defective arithmetic unit so that commands (for instance, comparisons) can no longer be correctly executed; and from changes in the software, also in software redundancy through defective program memories.

2. Discussion of the Prior Art

Through the utilization of two or more computers (multiprocessor systems) which mutually monitor each other, the functional reliability can be increased, but only with a considerable demand, inasmuch as for the exclusion of system errors, in general there are required diverse hardware and software (Dissertation by Knornschild, RTP 1981, Volume 8).

However, for general applications, the condition of the process under control is described not only through logical conditions (for example, switch positions, limit transducers), but also through continual parameters. This fact further restricts the applicability of a multiprocessor system because the coincidence of several computers cannot be verified by trivial comparisons at bit pattern levels, but L only through comprehensive, additional software procedures.

More readily controllable is a single computer which is more satisfactory from the standpoint of development and also manufacturing costs and which, for error protection, is coupled to a control unit. A simple procedure which is normally used for this purpose is based on the "watchdog" concept, adopted to await an always uniform report from the computer within a periodic time frame. However, this will generally only verify as to whether the computer is still at all operating but not whether it is properly operating in its essential functions and correctly executes commands that are relevant to safety. Watchdog circuits incorporating retriggerable trigger elements will, as a rule, detect only the first two of the above-mentioned error conditions (lack of a life signal). Nevertheless, this installation fails to detect, or detects with inadequate certainty, the remaining potential error conditions. Moreover, in most of the control circuits of this type a failure of the circuit itself will remain undetected.

Precisely for applications which are relevant to safety, however, in which jeopardy to personnel and systems must be precluded with a maximum of certainty, the detection of these failures is a necessity which can be achieved only by monitoring through additional problem-oriented hardware.

SUMMARY OF THE INVENTION

Accordingly, it is primary object of the present invention to develop a method of the type described which will facilitate the comprehensive monitoring of the computer with a minimum requirement of hardware, so as to render it applicable to safety considerations in controlling and monitoring processes, even where considerations of jeopardy (personal injuries) is at a maximum.

The method of the present invention is adapted for periodically monitoring the essential functions of a computer or, respectively, microcomputer, wherein, upon occurrence of a malfunction, the system being monitored is brought into a safe position. Moreover, this process is universally applicable, and provides another advantage in that suitable self-checking measures of the computer are safeguarded by an efficient monitoring procedure.

Through the intermediary of acknowledgement signals, the computer, on the basis of the fully dynamic operating mode of the check unit, will recognize all malfunctions in that area so that upon exclusion of all independent duplicate faults, there is produced a fail-safe monitoring system.

A high level of safety and fast response to fault conditions is achieved in that the reaction of the computer to the process presently takes place only after a comparison of the control and test signals, whereby responses during faultless operation are enabled only when coincidence exists between the control and test signals. This will prevent computer malfunctions from affecting the process. It facilitates the use of single-channel computer systems also for safety-relevant process applications.

Pursuant to a further feature of the present invention, the test signal is a digital test word, preferably of the processing scope of the computer. For the formation thereof only extremely simple hardware is necessary which nevertheless, substantially broadens the scope of monitoring in comparison with conventional watchdog circuits.

The digital test word can be dynamically varied in accordance with a certain fixed forming law as soon as certain conditions are present, so that a monitoring is additionally created in that the occurrence of these conditions must be detected by the computer itself.

Through the dynamic variation of the test word, as well as through coincidence of the word lengths of the control unit and computer, a substantial improvement is achieved in comparison with the scope of monitoring of conventional watchdog circuits. Through the simple, software-based implementation of the forming law there can be incorporated a very efficient monitoring of internal computer memory cells inasmuch as practically all possible combinations will occur and thereby also disclose hidden errors (dynamic cross-talk, stuck-at-errors).

A software-based forming law can be implemented so that during its processing, safety-relevant functions and functional groups of the computer are used, the freedom from error of which is indirectly proven by the coincidence of control and test signals.

The control signal which is to be compared with the test word can be, preferably, a data word emitted by the computer, with the data word preferably being emitted within a fixed, periodically repetitive time frame. This is an important criterion for computer applications involving real-time applications with control and simulation tasks.

The present invention extends to encompass a device for effectuation of the process, which consists of a control unit generating the test signals, and a comparator which accepts the test signals and the control signals of the computer. Such a device requires only a small demand in terms of hardware. The output pulse of the comparator or subsequent retriggerable time elements control a memory element in such a manner that when dissimilar input signals occur at the comparator, in essence, upon occurrence of a fault, the process is maintained at the last previously emitted errorless condition, or is forcibly brought into a preselected safety position (for instance, a shutdown).

In an advantageous aspect of the present invention, there is provided a comparator-driven redundant alarm unit for acoustically and/or optically recognizable indication of the error.

Through the use of a non-retriggerable timer which is connected to the output of the comparator, there can be created a narrow time frame for the periodic control or checking of the computer. For this purpose there can be advantageously provided, in particular, two non-retriggerable monoflops, of which the first monoflop is actuated by the comparator so as to trigger the second monoflop, the trailing edge thereof. As the second monoflop drops off, there is emitted a shifting pulse for the control unit which varies the test signal in accordance with a fixed forming law.

For this purpose, it is advantageous when the control unit is equipped with a pseudo-random generator which generates the test signal, and in which the generator is periodically actuated by a shifting pulse from the timer. Pursuant to another advantageous aspect of the invention, the feedback of the pseudo-random generator is so structured as to produce a maximally lengthy period of the test signal repeat and a maximal comprehensive scanning of all possible test signal patterns results.

In order to be able to sense a power failure and to continue operation, certain minimal functions (e.g. alarm sounding) the control unit is provided with a voltage supply, which is separate from that of the computer.

BRIEF DESCRIPTION OF THE DRAWINGS

Reference may now be had to the following detailed description and drawings which illustrate an embodiment of the present invention in a schematic arrangement; in which.

DETAILED DESCRIPTION

Figure 1:
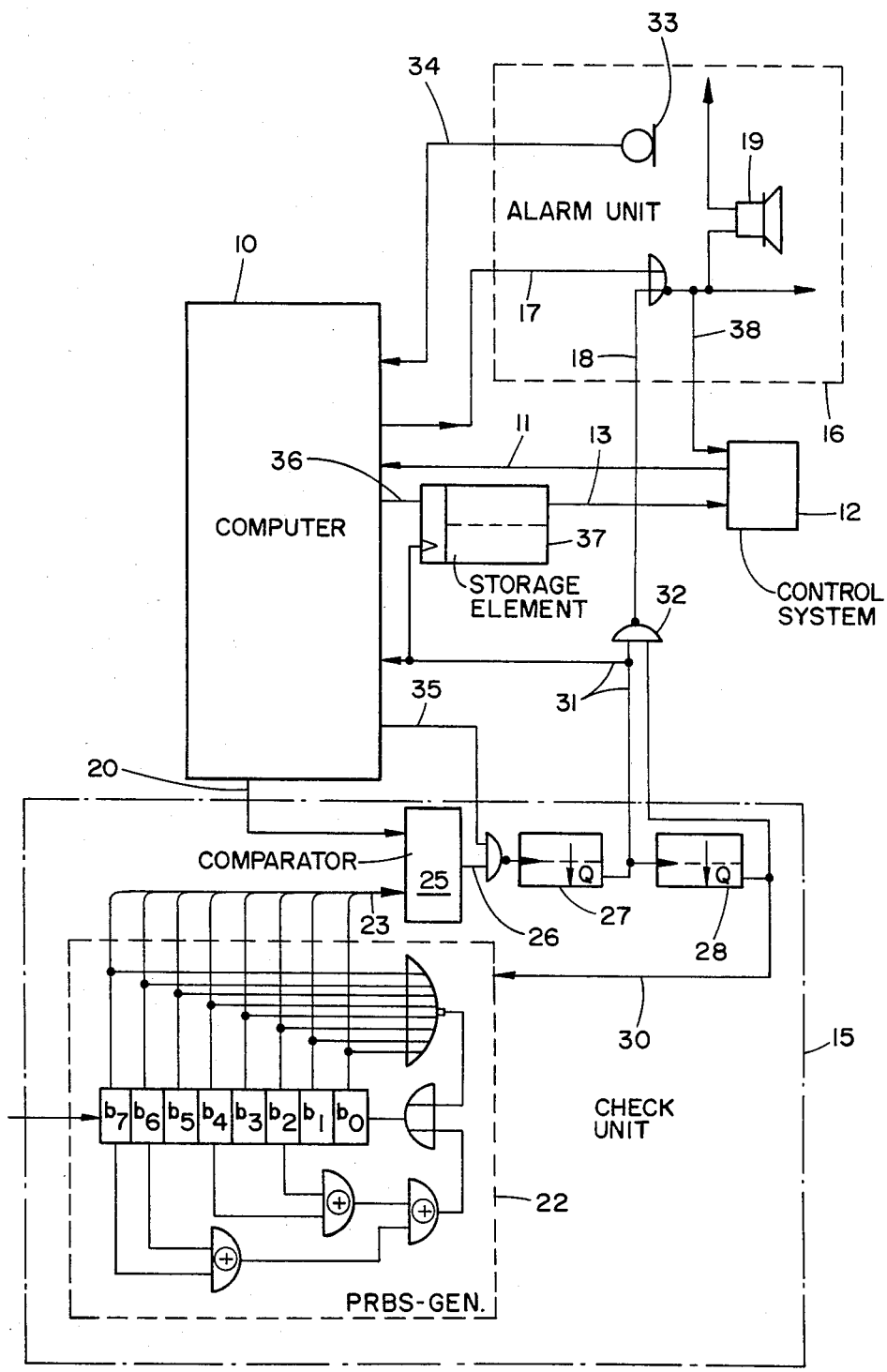
FIG. 1 illustrates a block circuit diagram of a functional testing arrangement for a computer.

A computer or microcomputer 10, as shown in FIG. 1, receives signals 11 from a process being monitored, such as, for instance, a control system 12, and itself intervenes in the process through output 13 to effect an optimization or modification in the process. Particularly in the event of a fault in the control system 12, which the computer 10 detects through a software-based monitoring functions, the computer is in a position to reestablish a correct condition through output 13 by enabling alternate functions (redundancy), or by immobilizing the control system 12 through switching off measures and so restore the safe condition of the process (fail-safe response).

The proper function of the computer 10 is, in turn, monitored by a check unit 15. An alarm unit 16 finally signals any errors or faults in that it is activated through the input 17 from the computer 10 as a result of some malfunction in the control system 12 or in the check unit 15, through the input 18 from the check unit 15 as a result of a malfunction in the computer 10 or in the check unit 15 in the form of an acoustic alarm through a claxon 19.

For monitoring the computer 10, its microprocessor generates a check signal at output 20 in the form of a check or data word, for instance, of 8 bits in length. Concurrently the output of the check signal is signaled through the output 35. With a pseudo-random number generator 22, or pseudo-noise binary signal generator, there is generated in the check unit 15 a test signal for the check signal of the computer 10 in the form of a test or check word of the same length as that of the data word, being emanated through the data bus 23. The test word and the check or control word are compared in a comparator 25. In the event that the two words completely coincide, the output 26 of the comparator 25, with the output 35 being enabled simultaneously, delivers a trigger pulse to a non-retriggerable monoflop 27 which, in turn, after the lapse of a time $t_{min}$, triggers an equally non-retriggerable monoflop 28 through the trailing edge of the pulse. After the lapse of a time $t_{Fenst}$, the monoflop 28 similarly drops off to supply the generator 22 with a shift clock pulse 30.

Figure 2:
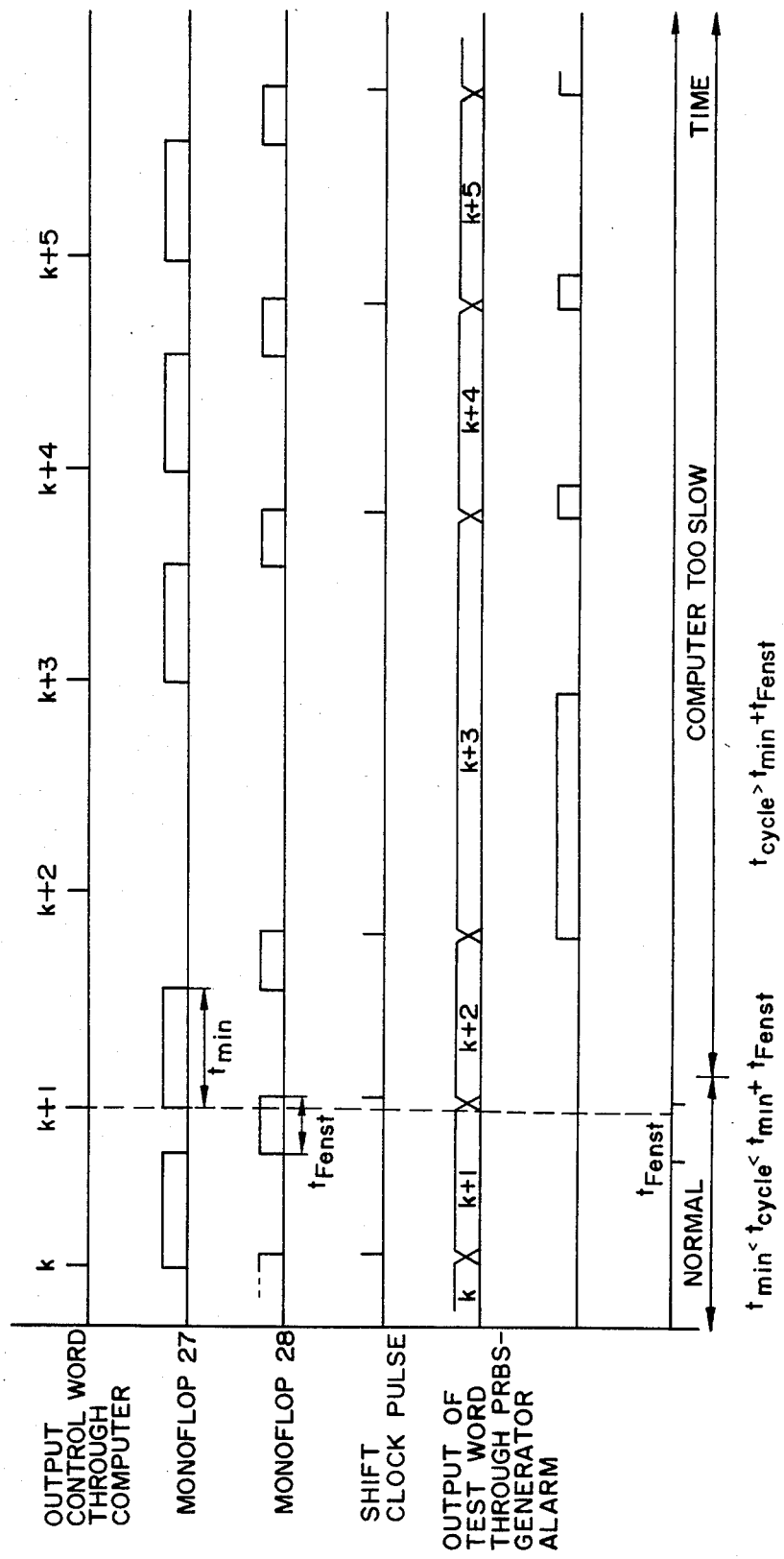
FIG. 2 illustrates a time diagram representative of the computer periodically issuing proper data words.

During flawless operation of the computer 10, the computer 10 in accordance with the timing diagram of FIG. 2, delivers a check word "k+1" within the time frame $t_{Fenst}$ for a control word, for example, "k+1".

This causes the comparator 25 to trigger the monoflop 27. After the lapse of time $t_{min}$, the monoflop 27 drops off and triggers the monoflop 28, which has dropped off in the interim, so as to determine the next time frame within which the next control word must fall. The next control word "k+2" has been formed in the interim, as the monoflop 28 has dropped off, by means of the shift clock pulse 30 generated during the process. Simultaneously the function of the monoflop 27 is dynamically acknowledged to the computer through an acknowledgement line 31.

When, as a consequence of a defect in the computer 10, the next check word "k+2" is not emitted within the time frame, the first monoflop 27 will not be triggered so that, after the second monoflop 28 has dropped off, both monoflops 27 and 28 are in the dropped condition to thereby activate the alarm unit 16 through an NOR gate 32 and the input 18.

In the same manner a fault in the check unit 15 is sensed and reported in that, if one or both monoflops have dropped off, the NOR gate 32 is driven directly, or if the signal generator 22 is defective, the comparator 25 will not emit a trigger pulse as the result an improper test word. In this manner there is obtained a partial fail-safe monitoring system for the computer, with failures in the check unit 15 disclosing themselves.

Special software-based measures for the disclosure of hidden potential faults in the check unit 15 are rendered possible in that the computer 10 issues false check words or false signals 35, and then verifies the response of the check unit 15 by evaluating the signals 31. In the event of a fault, the computer is then in a position to raise an alarm through the input 17 of the alarm unit.

Figure 3:
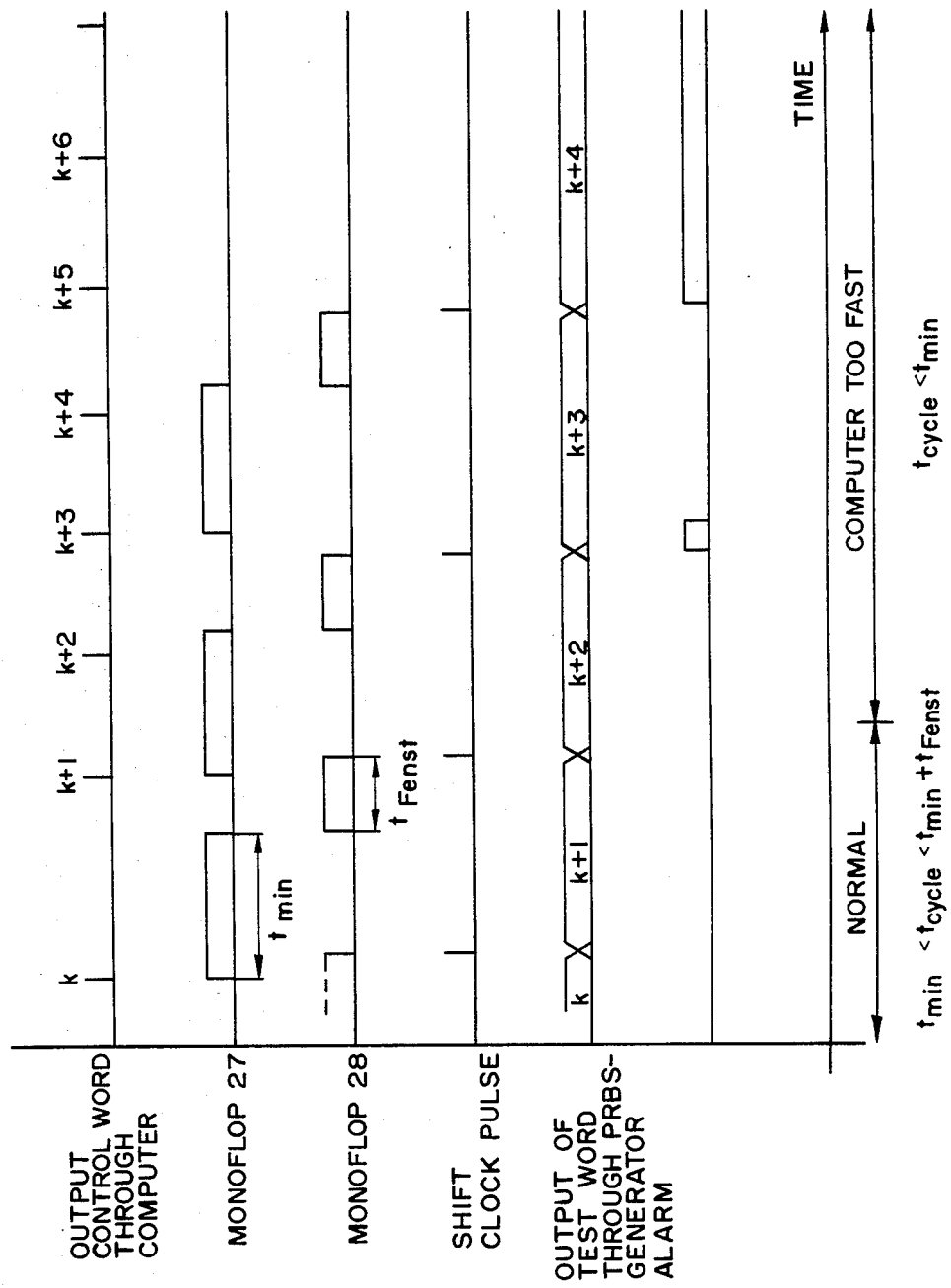
FIG. 3 is a further time diagram similar to that of FIG. 2.

The alarm will also be raised, as shown in the timing diagram of FIG. 2, when the computer 10 periodically issues proper data words, but does so at excessively long intervals. The same situation occurs when, in accordance with FIG. 3, the reporting time of the computer 10 is too short.

The action of output signals 36 of the computer 10 on the control system 12 is delayed by the intervention of a storage element 37. Through the issuance of a new, proper check word and triggering of the timer 27 the proper function of the computer 10 is acknowledged, and thus the validity of the output signal 36, wherein the storage element 37, having been triggered by the acknowledgement signal 31, accepts the signal at its output 13 and allows it to act on the process.

The alarm unit 16 and the NOR gate 32, which are not included in the self-monitoring system, are either dynamically fail-safe, duplexed or tested at regular intervals. The latter test can be carried out by using the computer under its self-check routine, wherein the data word is issued with a delay to transmit a brief warning beep. The proper function of the NOR gate 32 and of the alarm unit 16 is verified by the computer 10 sampling the alarm report line 34 which is connected, for instance, to an acoustic alarm detector 33.

The test word shaping or forming law must be formed in the computer through a recursive relationship:

$$b_{i+1}^{new} := b_i^{old}$$

This relationship defines the bits of the new word $b^{new}$ in terms of the bits of the old words $b^{old}$, such that all of the bits of the new word can be derived from the bits of the old word, except $b_0^{new}$ which is derived from the following relationship in which the symbol $\oplus$ defines, as in logical diagrams, an exclusive OR relationship.

$$b_0^{new} = (b_7^{old} \oplus b_6^{old}) \oplus (b_4^{old} \oplus b_2^{old})$$

Accordingly, the bit $b_0^{new}$ of the new work can be determined by three exclusive OR relationship by starting with the seventh, sixth, fourth and second bits of the old word.

During the course of a period of 255 shift operations all combinations are scanned, except for the impermissible condition 00000000, so that also faults or errors may be detected which are based on certain bit combinations.

Furthermore, any additional operations (arithmetic, transfer comparison commands) can be executed, and again be canceled by other operations. This affords another advantage in that the degree of redundancy is determined by the software and can therefore be readily adapted to conform the requirements and possibilities, such as time requirements and level of safety.

When the various commands are distributed over the application program, this affords an independent possibility of verifying the proper execution of linearly or defined branched off program loops. This case is presently encountered with control problems.

In order to ensure the proper function of program portions which remain unused during troublefree operation, such as alarm processing, a self-check and verification of the contents of the program memory must be made at regular intervals. Appropriate completion and the result of the self-check can be monitored by the word-oriented monitoring or surveillance unit.

What is claimed is:

1. A method for testing computers used in the control or monitoring of processes, including a check unit for testing the computer, comprising:
    a. generating check signal by the computer in the form of data words;
    b. generating test signals by the check unit in the form of digital test words of the same length as that of the data work;
    c. implementing a predetermined fixed shaping law by software such that during processing of the software the safety functions and functional groups of the computer are utilized;
    d. dynamically modifying the digital test words pursuant to the shaping law;
    e. comparing the check signals with the dynamically modified digital test works; and
    f. the check unit having an output for generating a comparator signal to act upon the computer to prevent the computer from affecting the process, to emit an alarm signal, and to transfer or switch the process to a safe condition when the check signals and the test signals do not coincide or are not generated within a given time frame.

2. A method as claimed in claim 1, including a storage element, the computer emitting an output signal for acting on the process, and storing said output signal in said storage element, the storage element emitting said output signal to the process after comparison of the check signal and the test signal.

3. A method as claimed in claim 2, comprising generating the check signal within a fixed, periodically recurrent time frame.

* * * * *